(12) United States Patent
Nishi et al.

(10) Patent No.: US 9,305,767 B2
(45) Date of Patent: Apr. 5, 2016

(54) LIQUID PROCESSING APPARATUS, LIQUID PROCESSING METHOD AND STORAGE MEDIUM

(75) Inventors: Kenji Nishi, Kumamoto (JP); Kazuhiro Takeshita, Kumamoto (JP); Nobuhiro Ogata, Kumamoto (JP); Satoru Tanaka, Kumamoto (JP); Shogo Mizota, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1057 days.

(21) Appl. No.: 13/417,388

(22) Filed: Mar. 12, 2012

(65) Prior Publication Data
US 2012/0234356 A1    Sep. 20, 2012

(30) Foreign Application Priority Data
Mar. 16, 2011    (JP) ................. 2011-058240

(51) Int. Cl.
*H01L 21/02* (2006.01)
*H01L 21/67* (2006.01)

(52) U.S. Cl.
CPC ...... *H01L 21/02052* (2013.01); *H01L 21/6708* (2013.01); *H01L 21/67051* (2013.01)

(58) Field of Classification Search
None
See application file for complete search history.

(56) References Cited

U.S. PATENT DOCUMENTS

| 7,891,366 | B2 | 2/2011 | Ito |
| 8,043,469 | B2 | 10/2011 | Nakamori et al. |
| 8,133,327 | B2 | 3/2012 | Tokuno et al. |
| 2004/0053147 | A1* | 3/2004 | Ito ................................. 430/30 |
| 2006/0189138 | A1* | 8/2006 | Nishimura et al. ........... 438/692 |
| 2007/0212884 | A1* | 9/2007 | Yamamoto et al. ........... 438/694 |
| 2008/0022928 | A1* | 1/2008 | Sanada et al. .................. 118/52 |

FOREIGN PATENT DOCUMENTS

| CN | 101090063 A | | 12/2007 |
| JP | 63-072373 A | | 4/1988 |
| JP | 04-278517 A | | 5/1992 |
| JP | 05-166712 A | | 7/1993 |
| JP | 05166712 A | * | 7/1993 |
| JP | 11-151462 A | | 6/1999 |
| JP | 2001-291660 A | | 10/2001 |
| JP | 2001291660 A | * | 10/2001 |
| JP | 2003-174006 A | | 6/2003 |
| JP | 2009-158565 A | | 7/2009 |
| JP | 2009-224513 A | | 10/2009 |
| JP | 2010-028059 A | | 2/2010 |
| JP | 2010-161164 A | | 7/2010 |
| KR | 10-2009-0045005 A | | 5/2009 |

* cited by examiner

*Primary Examiner* — Nicole Blan
(74) *Attorney, Agent, or Firm* — Pearne & Gordon LLP

(57) ABSTRACT

There is provided a liquid processing apparatus including a rotation unit configured to hold the target substrate and rotate the target substrate around a vertical axis; a processing solution supply nozzle configured to supply the processing solution to the surface of the target substrate being rotated; a first gas supply unit configured to form a downward flow of a first gas that flows over the entire surface of the target substrate and is introduced into a cup in order to form a processing atmosphere suitable for a liquid process to be performed; and a second gas supply unit configured to form a downward flow of a second gas different from the first gas in a region outside the downward flow of the first gas. The first gas supply unit and the second gas supply unit are provided at a ceiling portion of the housing serving as the processing space.

9 Claims, 13 Drawing Sheets

LIQUID PROCESSING APPARATUS, LIQUID PROCESSING METHOD AND STORAGE MEDIUM

CROSS-REFERENCE TO RELATED APPLICATION

This application claims the benefit of Japanese Patent Application No. 2011-058240 filed on Mar. 16, 2011, the entire disclosures of which are incorporated herein by reference.

FIELD OF THE INVENTION

The present disclosure relates to a technology of controlling an atmosphere around a target substrate on which a liquid process is performed.

BACKGROUND OF THE INVENTION

In a semiconductor device manufacturing process, a liquid process is performed on a target substrate such as a semiconductor wafer (hereinafter, referred to as a "wafer"). As an example of such a liquid process, there is a cleaning process of the wafer by a cleaning solution. A liquid processing unit for used in the liquid process includes, for example, a cup configured to receive a processing solution; a rotation holding unit such as a spin chuck provided in the cup; and a processing solution supply nozzle configured to supply the processing solution to the substrate. In the cleaning process of the wafer, by supplying multiple kinds of processing solutions in a preset sequence to a front surface of the wafer being rotated, the liquid process is performed.

The spin chuck and the cup for used in the liquid process are provided in a common housing so as to be separated from an outside atmosphere. Clean air is supplied from a fan filter unit (FFU) provided on the housing, and a downward flow of the clean air is formed within the housing. The downward flow of the clean air suppresses generation of particles and mist caused by loading/unloading the wafer or performing the liquid process. As a result, the wafer and the inside of the housing are maintained in a clean state.

In the cleaning process, an alkaline or acid processing solution is supplied to the wafer, and the wafer is cleaned by a rinse solution such as deionized water (DIW). Thereafter, by supplying IPA (IsoPropyl alcohol) to the wafer, an IPA drying process is performed, and the processing solution remaining on the front surface of the wafer is removed with the IPA. During the IPA drying process, an atmosphere around the wafer needs to be maintained at low humidity.

In the liquid process for performing on the front surface of the wafer having thereon a metallic wiring such as a copper wiring, in order to prevent oxidation of the metallic wiring, it is required to control oxygen concentration on the front surface of the wafer to be low.

In this regard, for example, Patent Document 1 describes a technology capable of preventing a watermark caused by particles entering a rinse solution and a native oxide film by forming a downward flow of an inert gas within the entire apparatus so as to cover an entire target surface of a substrate. However, in Patent Document 1, since the inert gas is supplied into the entire space of the apparatus, running costs for the liquid process are increased.

Meanwhile, Patent Document 2 describes a liquid processing apparatus that performs an etching process by supplying a processing solution to a bottom surface and a side surface of a target substrate. In the liquid processing apparatus, in order to prevent the processing solution from entering the top surface of the target substrate, a top plate is provided so as to cover a top surface of the target substrate, and an inert gas is supplied from a central portion of the top plate toward the top surface of the target substrate. In the liquid processing apparatus, a liquid process is performed on the bottom surface and the side surface of the target substrate. However, when the liquid process is performed on the entire top surface of the target substrate, in order to avoid interference between a processing solution supply nozzle and the top plate, a special processing solution supply unit is required. Further, when the target substrate is transferred, in order to avoid interference between the target substrate and the top plate, a moving device for relatively moving the top plate with respect to a holding unit for holding thereon the target substrate is additionally required.

Patent Document 1: Japanese Laid-Open Patent Application No. 2003-174006: Claim 1 and FIG. 1

Patent Document 2: Japanese Laid-Open Patent Application No. 2010-028059: Claim 4, paragraph 0021, and FIG. 1

BRIEF SUMMARY OF THE INVENTION

In view of the foregoing, illustrative embodiments provide a liquid processing apparatus and a liquid processing method capable of forming a processing atmosphere (e.g., a low humidity atmosphere or a low oxygen atmosphere) suitable for a liquid process to be performed on a front surface of a target substrate. The illustrative embodiments also provide a storage medium storing therein the liquid processing method.

In accordance with an aspect of an illustrative embodiment, there is provided a liquid processing apparatus that performs a liquid process by supplying a processing solution to a surface of a target substrate. The liquid processing apparatus includes a housing in which the liquid process is performed; a rotation unit configured to hold the target substrate within the housing and rotate the target substrate around a vertical axis; a processing solution supply nozzle configured to supply the processing solution to the surface of the target substrate being held and rotated by the rotation unit; a cup provided around the rotation unit; a first gas supply unit, provided to face the target substrate held by the rotation unit, configured to form a downward flow of a first gas that flows over the entire surface of the target substrate and is introduced into the cup in order to form a processing atmosphere on the surface of the target substrate; and a second gas supply unit configured to form a downward flow of a second gas different from the first gas in a region outside the downward flow of the first gas. Here, the first gas supply unit and the second gas supply unit may be provided at a ceiling portion of the housing.

The liquid processing apparatus may have the following features. The downward flow of the first gas may be a trumpet-shaped gas flow formed from the first gas supply unit toward the cup. A flow rate of the first gas supplied from the first gas supply unit may be higher than a flow rate of a gas flow flowing toward a periphery of the target substrate due to the rotation of the target substrate. A discharge flow rate of the first gas from the first gas supply unit may be equal to a discharge flow rate of the second gas from the second gas supply unit. The liquid processing apparatus may further include a first gas exhaust port, provided at an inside of the cup, configured to mainly exhaust the first gas; and a second gas exhaust port, provided at an outside of the cup, configured to mainly exhaust the second gas. The first gas supply unit may be configured to selectively supply the first gas or the second gas. The first gas supply unit may be configured to be movable between a position for forming the downward flow of the first gas and a retreated position within the second gas supply unit. Further, when the first gas supply unit is positioned at the retreated position, instead of the downward flow of the first gas, the second gas supply unit may be further configured to form the downward flow of the second gas flowing toward the entire surface of the target substrate. The target substrate may have a circular shape, and the first gas supply unit may include a circular discharge port having a diameter of about 100 mm or more and smaller than a diameter of the target substrate. The liquid processing apparatus may further include a flow rectifying plate, having a multiple number of vent holes which supplies the first gas from the discharge port at a uniform flow rate, provided at the discharge port. The first gas may be dry air or an inert gas.

In accordance with an illustrative embodiment, in order to form the processing atmosphere suitable for the liquid process, the downward flow of the first gas is formed toward the entire surface of the target substrate as the liquid processing target object, and the downward flow of the second gas different from the first gas is formed in a region outside the downward flow of the first gas. Accordingly, the processing atmosphere suitable for the liquid process to be performed can be locally formed on the entire surface of the target substrate.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
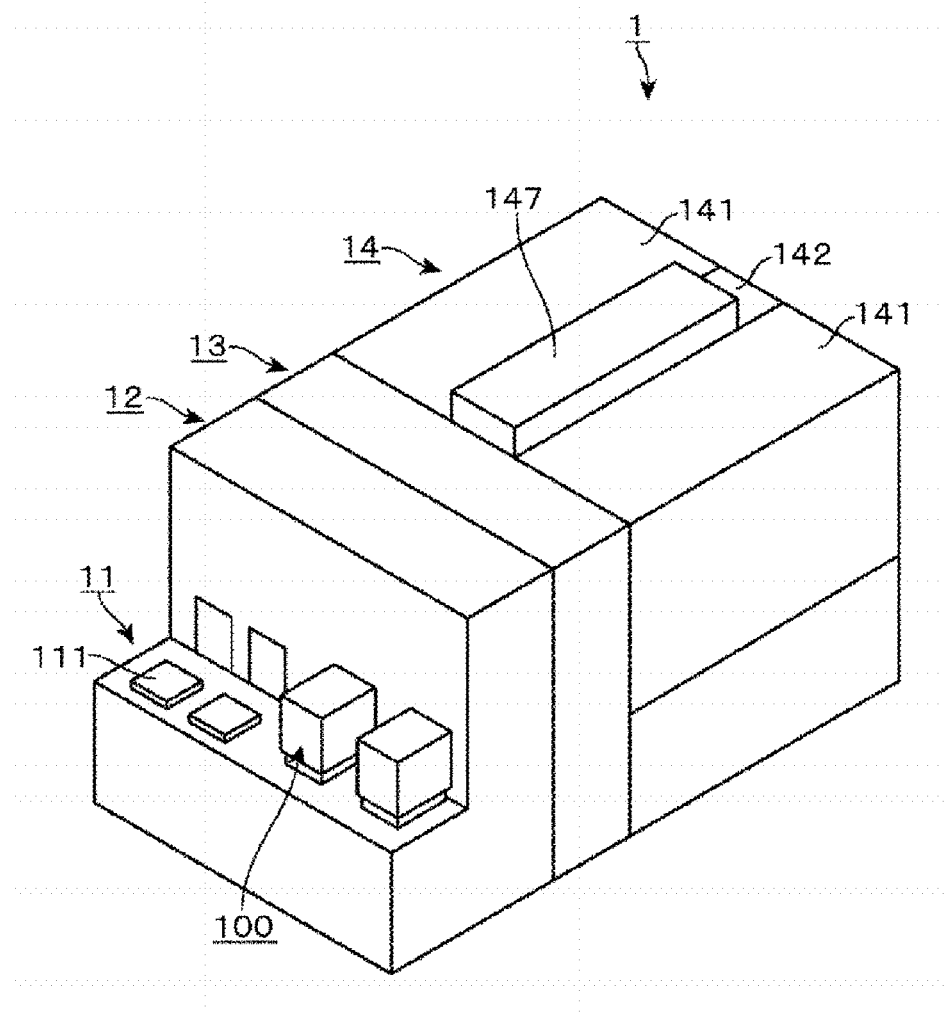
FIG. 1 is an exterior perspective view of a liquid processing system in accordance with an illustrative embodiment.

Hereinafter, there will be explained a liquid processing apparatus in accordance with an illustrative embodiment applied to a liquid processing unit configured to clean a front surface and a rear surface of a semiconductor wafer. As shown in an exterior perspective view of FIG. 1 and a transversal plane view of FIG. 2, a liquid processing system 1 having a liquid processing unit 2 includes a mounting block 11, a loading/unloading block 12, a transit block 13, and a liquid processing block 14. The mounting block 11 is configured to mount thereon FOUPs 100 each for accommodating a multiple number of wafers W therein. The loading/unloading block 12 is configured to load and unload the wafers W to and from the FOUPs 100 mounted on the mounting block 11. The transit block 13 is configured to transit the wafers W between the loading/unloading block 12 and the liquid processing block 14 that is located at a rear end of the liquid processing system 1. The liquid processing block 14 is configured to perform a liquid process on the wafers W. The mounting block 11, the loading/unloading block 12, the transit block 13 and the liquid processing block 14 are arranged so as to be adjacent to each other in this sequence from the front side when viewed from the mounting block 11.

In the mounting block 11, the FOUPs 100 for accommodating therein the multiple number of wafers W horizontally are mounted on a mounting table 111. The loading/unloading block 12 serves to transfer the wafers W, and the transit block 13 serves to transit the wafers W. The loading/unloading block 12 and the transit block 13 are provided in a housing.

The loading/unloading block 12 has a first wafer transfer device 121. The first wafer transfer device 121 has a transfer arm 122 for holding the wafer W thereon; and a device for moving the transfer arm 122 back and forth. Further, the first wafer transfer device 121 further has a device configured to move along a horizontal guide 123 (see FIG. 2) elongated in an arrangement direction of the FOUPs 100; a device configured to move along a non-illustrated vertical guide positioned in a vertical direction; and a device configured to rotate the transfer arm 122 on a horizontal plane. The wafer W is transferred by the first wafer transfer device 121 between the FOUPs 100 and the transit block 13.

The transit block 13 has a transit shelf 131 for mounting the wafer W thereon. In the transit block 13, the wafer W is transferred between the transfer devices of the loading/unloading block 12 and the liquid processing block 14 (i.e., between the aforementioned first wafer transfer device 121 and a second wafer transfer device 143 to be described later) via the transit shelf 131.

The liquid processing block 14 includes liquid processing sections 141 and a transfer section 142 that are arranged in a housing. Multiple liquid processing units 2 are disposed in each liquid processing section 141, and the wafer W is transferred in the transfer section 142. The transfer section 142 has the second wafer transfer device 143 in a space elongated in a forward/backward direction from a connection part to the transit block 13 as a base. The second wafer transfer device 143 has a transfer arm 144 for holding thereon the wafer W and a device for moving the transfer arm 144 back and forth.

Figure 2:
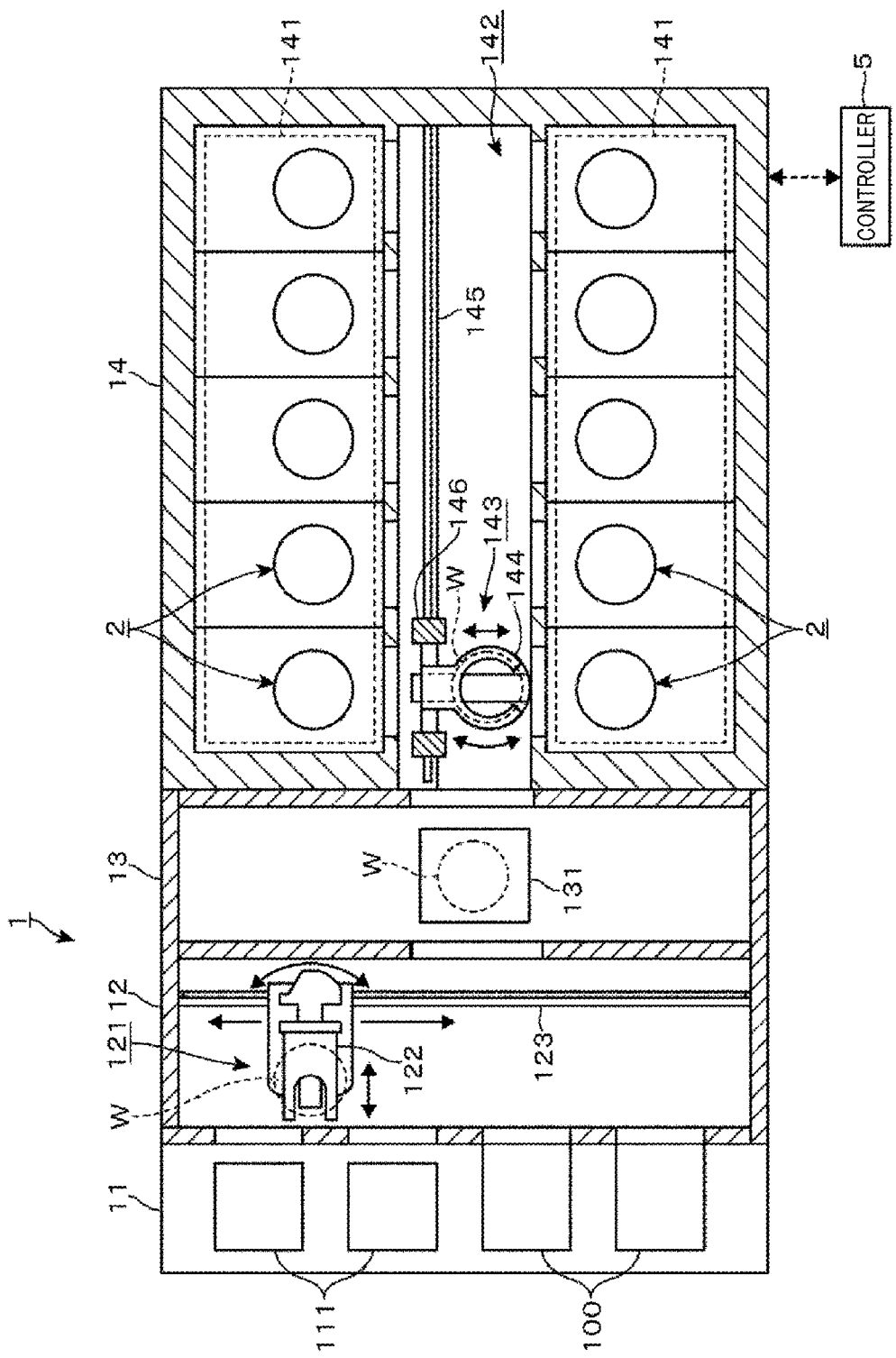
FIG. 2 is a transversal plane view of the liquid processing system.

The second wafer transfer device 143 further has a device configured to move along a horizontal guide 145 (see FIG. 2) elongated in the forward/backward direction; a device configured to move along a vertical guide 146 provided in a vertical direction; and a device configured to rotate the transfer arm 144 on a horizontal plane. The wafer W can be transferred by the second wafer transfer device 143 between the transit shelf 131 and each liquid processing unit 2. As shown in FIG. 1, provided on the transfer section 142 is a fan filter unit (FFU) 147 for supplying clean air into a space of the liquid processing block 14. As shown in FIG. 2, in the liquid processing section 141, a multiple number of, e.g., five (5) liquid processing units 2 are arranged adjacent to each other in a direction which the transfer section 142 is elongated. Thus, in total, ten (10) liquid processing units 2 are provided in the liquid processing system 1.

The configuration of the liquid processing unit 2 provided in the liquid processing section 141 will be described with reference to FIG. 3. The liquid processing unit 2 is configured as a single-wafer processing unit that performs a liquid process on wafers W sheet by sheet through a spin process. The liquid processing unit 2 includes a processing space 21 formed within a housing; and a gas supply unit 20 provided on the processing space 21 (i.e., at a ceiling portion of the housing). The processing space 21 includes a rotation plate 33, a rotation shaft 341, a liquid supply line 342, a processing solution supply nozzle 35, an inner cup 32, and an outer cup 31. The rotation plate 33 holds thereon the wafer W. The rotation shaft 341 supports the rotation plate 33 from a rear surface (bottom surface) thereof and is configured to rotate the rotation plate 33 by being rotated by means of a non-illustrated rotation motor. The liquid supply line 342 is inserted through the inside of the rotation shaft 341, and a processing solution is supplied to the rear surface (bottom surface) of the wafer W through the liquid supply line 342. The processing solution supply nozzle 35 supplies the processing solution to the front surface (top surface) of the wafer W. The inner cup 32 is configured to receive the processing solution scattered from the wafer W being rotated, and, then, discharge the received processing solution to the outside. The outer cup 31 accommodates the rotation plate 33 and the inner cup 32 therein, and is configured to exhaust a gas flow flowing from a region above the wafer W toward a periphery of the wafer W.

The rotation plate 33 is a circular plate-shaped member having an opening at a central portion thereof. Provided on a front surface of the rotation plate 33 are a multiple number of holding members 331 for holding thereon the wafer W. As a result, the wafer W is held on the rotation plate 33 with a gap therebetween. The processing solution is supplied from the liquid supply line 342 through the opening at the central portion of the rotation plate 33. The supplied processing solution is diffused over the entire rear surface of the wafer W through the gap between the wafer W and the rotation plate 33. The rotation shaft 341 is held on a bearing 343 provided at a bottom portion of the processing space 21, and the rotation shaft 341 is rotated around a vertical axis. The rotation plate 33, the rotation shaft 341, and the rotation devices thereof are referred to as a rotation unit in accordance with the illustrative embodiment.

Supporting pins (not illustrated) for supporting the wafer W from the rear surface thereof are provided on an upper end of the liquid supply line 342. A lifting device configured to move the liquid supply line 342 up and down is provided at a lower end of the liquid supply line 342. By moving up and down the entire part of the liquid supply line 342, the liquid support line 342 can be protruded from or retracted into the opening of the rotation plate 33. With this configuration, the wafer W can be moved up and down, while being held on the supporting pins, between a transfer position where the wafer W is transferred from/to the transfer arm 144 and a processing position on the rotation plate 33.

The liquid supply line 342 supplies, toward the rear surface of the wafer W, an alkaline processing solution such as a SC1 solution (mixed solution of ammonia and oxygenated water) or an acid processing solution such as a DHF (Dilute HydroFluoric acid) aqueous solution (hereinafter, referred to "DHF"), and a rinse solution such as DIW for used in a rinse process.

Meanwhile, the processing solution supply nozzle 35 for supplying the processing solution to the front surface of the wafer W is supported by a nozzle arm 351, and is configured to be moved between a processing position above the wafer W held on the rotation plate 33 and a retreated position retreated from this processing position. Further, the processing solution supply nozzle 35 supplies an organic solvent such as IPA (IsoPropyl Alcohol) for used in a drying process as well as the alkaline or the acid processing solution, and the rinse solution.

Figure 3:
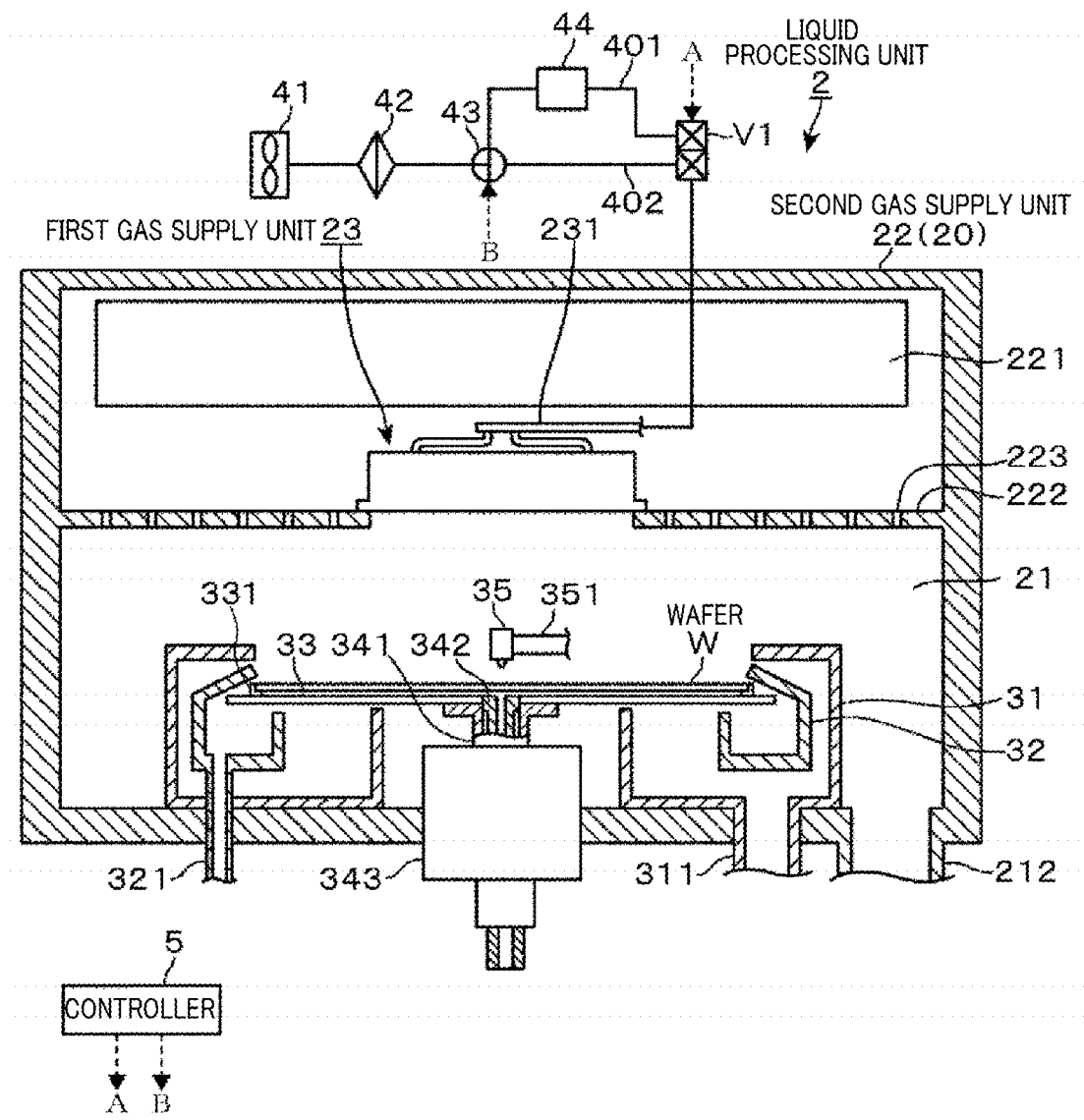
FIG. 3 is a longitudinal side view of a liquid processing unit provided in the liquid processing system.

The inner cup 32 shown in FIG. 3 has a circular ring-shaped member surrounding the wafer W held on the rotation plate 33. A processing solution received in the inner cup 32 is discharged through a liquid drain line 321 connected to a bottom surface of the inner cup 32. A gas exhaust line 311 for exhausting a gas is provided on a bottom surface of the outer cup 31. A gas flow flowing from a region above the wafer W toward the periphery thereof is mainly exhausted from the gas exhaust line 311. Openings are formed above the outer cup 31 and the inner cup 32, and the diameters thereof are larger than the diameter of the wafer W. The wafer W supported on the liquid supply line 342 may be moved up and down through these openings.

An opening is formed at a side surface of the processing space 21 in contact with the transfer section 142, and an opening/closing door 211 for opening and closing the opening is provided. After the opening/closing door 211 is opened, the transfer arm 144 can enter the processing space 21 through the opening. As shown in FIG. 3, formed in the bottom portion of the processing space 21 is a gas exhaust line 212 for exhausting a downward flow of clean air within the processing space 21.

In the above-described liquid processing unit 2, various processing solutions are supplied to the front surface of the wafer W being rotated. Thereafter, an IPA drying process using IPA is performed to remove processing solutions remaining on the front surface of the wafer W. As explained in the section "BACKGROUND OF THE INVENTION", during the IPA drying process, it is required to control an atmosphere around the wafer W to be at low humidity. However, an inert gas such as a nitrogen gas and dry air are more expensive than clean air. Accordingly, in the liquid processing unit 2 in accordance with the illustrative embodiment, a gas containing less moisture is locally supplied toward a region where the IPA drying process is performed. Meanwhile, normal clean air, which is not controlled to contain less moisture, is supplied toward a region that does not affect the IPA drying process. Accordingly, a processing atmosphere can be controlled to be at a low humidity, and running costs can be reduced. A detailed configuration thereof will be described.

As shown in FIG. 3, the gas supply unit 20 is provided on the processing space 21. The gas supply unit 20 includes a first gas supply unit 23 and a second gas supply unit 22. The first gas supply unit 23 is configured to form a downward flow of clean air containing less moisture (corresponding to a first gas; hereinafter, referred to as "dry air") toward the entire front surface of the wafer W held on the rotation plate 33. The second gas supply unit 22 is configured to form a downward flow of normal clean air, which is not controlled to contain less moisture, (corresponding to a second gas; hereinafter, referred to as "normal air") in a region other than the region where the downward flow of the first gas is formed.

Figure 4:
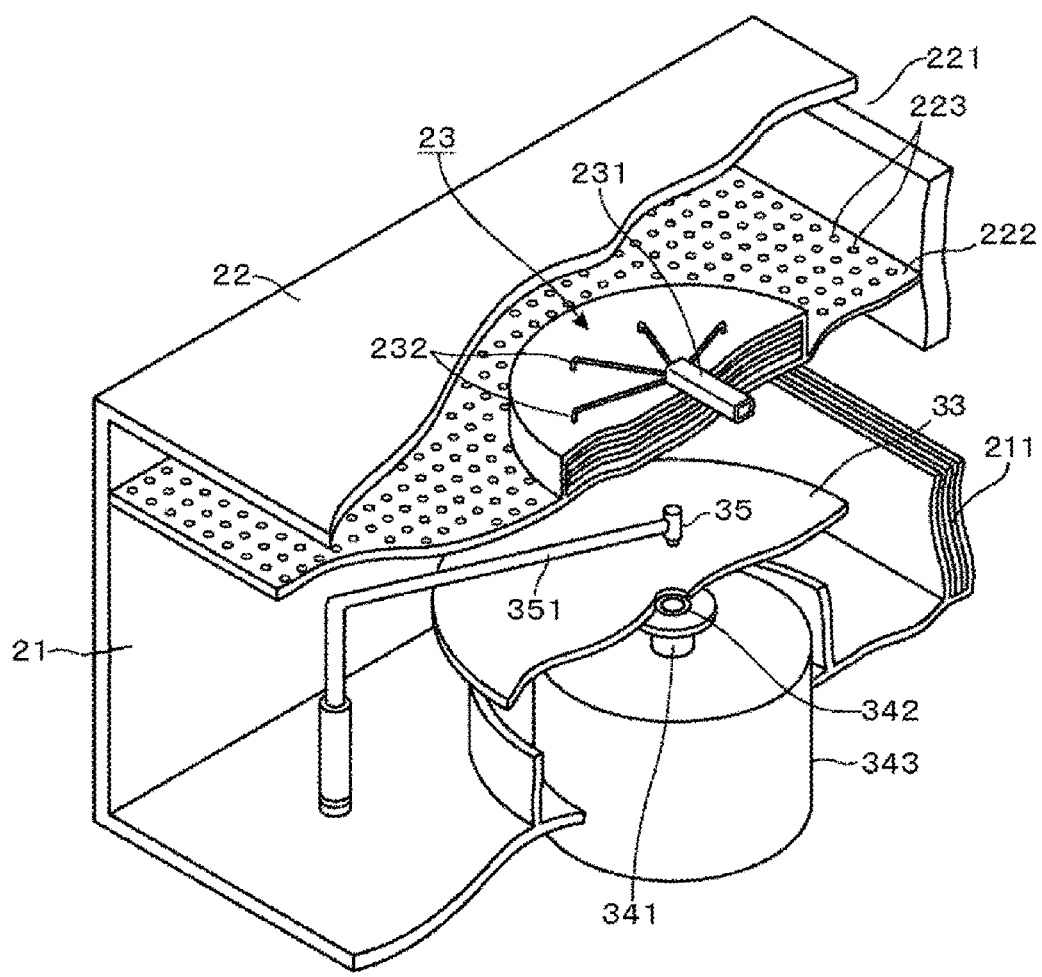
FIG. 4 is a partial broken perspective view showing an internal configuration of the liquid processing unit.

Now, the second gas supply unit 22 will be explained. The second gas supply unit 22 is a cylindrical-shaped chamber configured to cover the entire ceiling surface of the processing space 21 where the liquid process is performed. As shown in FIGS. 3 and 4, an opening 221 is formed in a sidewall of the second gas supply unit 22 in contact with the transfer section 142. The normal air supplied from the FFU 147 provided on the transfer section 142 is introduced into the second gas supply unit 22 through the opening 221. For the convenience of illustration, the outer cup 31 and the inner cup 32 are omitted in the perspective view of FIG. 4.

A bottom plate 222 of the second gas supply unit 22 serves as a ceiling surface of the processing space 21. A multiple number of vent holes 223 are formed in the bottom plate 222 by e.g., punching the bottom plate 222. The normal air introduced into the second gas supply unit 22 is supplied into the processing space 21 through the vent holes 223. Thereafter, the normal air is mainly exhausted through the gas exhaust line 212 formed in the bottom portion of the processing space 21. As a result, a downward flow of the normal air flowing from the ceiling surface of the processing space 21 toward the bottom portion thereof is formed within the processing space 21.

The first gas supply unit 23 is provided within the chamber serving as the second gas supply unit 22. The first gas supply unit 23 is provided above the wafer W held on the rotation plate 33 so as to face the wafer W. The first gas supply unit 23 is configured to form the downward flow of the dry air flowing from the region above the wafer W toward the entire front surface thereof. After flowing toward the entire front surface of the wafer W from the region above the wafer W, the dry air is mainly exhausted from the gas exhaust line 311 formed in the outer cup 31.

Figure 7:
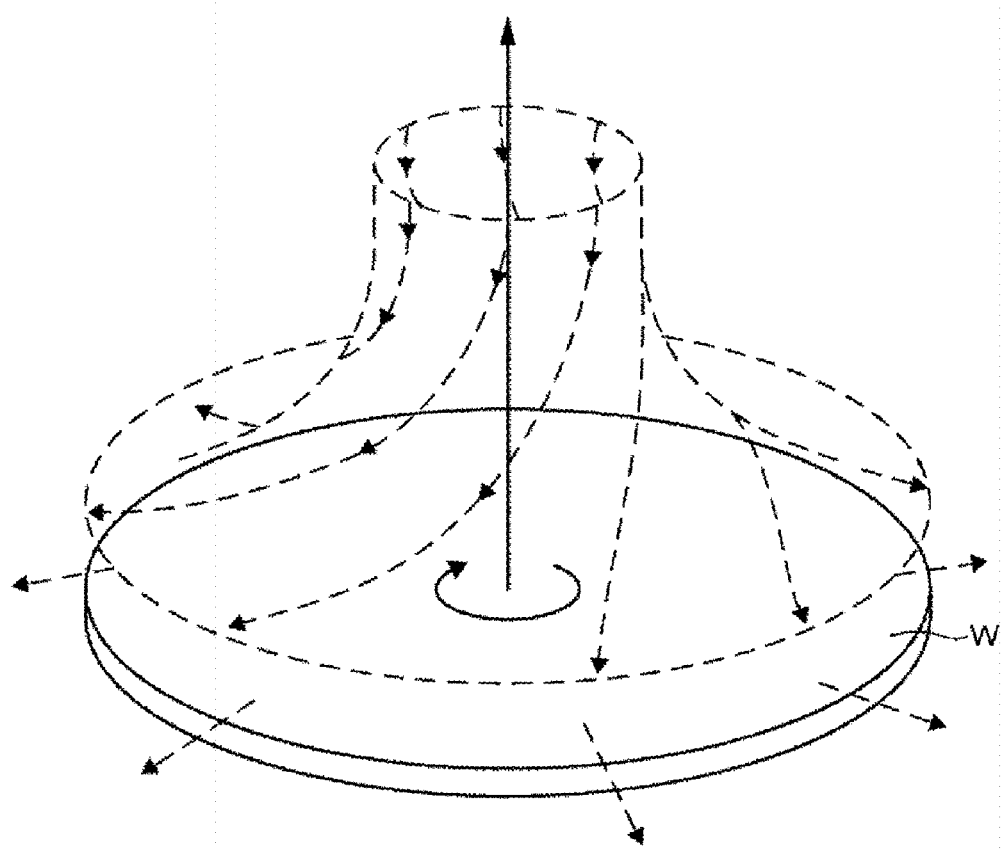
FIG. 7 is an explanatory diagram for describing a gas flow formed above a wafer being rotated around a vertical axis.

As shown in FIG. 7, when the wafer W is rotated, by viscosity between the wafer W and a gas around the wafer W and by centrifugal force of the gas due to the wafer W's rotation, a gas introduced from the region above the wafer W is moved toward the periphery of the wafer W. That is, a trumpet-shaped (or cone-shaped) air flow is formed from the first gas supply unit 23 toward the periphery of the wafer W. Accordingly, if the dry air is supplied from the first gas supply unit 23 in an amount equal to or greater than an amount of the air flow moving toward the periphery of the wafer W while not disturbing the trumpet-shaped air flow, it is possible to prevent the normal air around the trumpet-shaped air flow from being introduced into the flow of the dry air. Accordingly, the entire front surface of the wafer W is covered with the dry air. As a result, it is possible to prevent the moisture from being supplied to the front surface of the wafer W. Moreover, it is possible to control the front surface of the wafer W as a liquid processing target object and the atmosphere (processing atmosphere) around the wafer W to be locally at low humidity. Further, the downward flow of the normal air is formed around the trumpet-shaped air flow, so that the processing space 21 can be controlled to be in a clean state.

Figure 5:
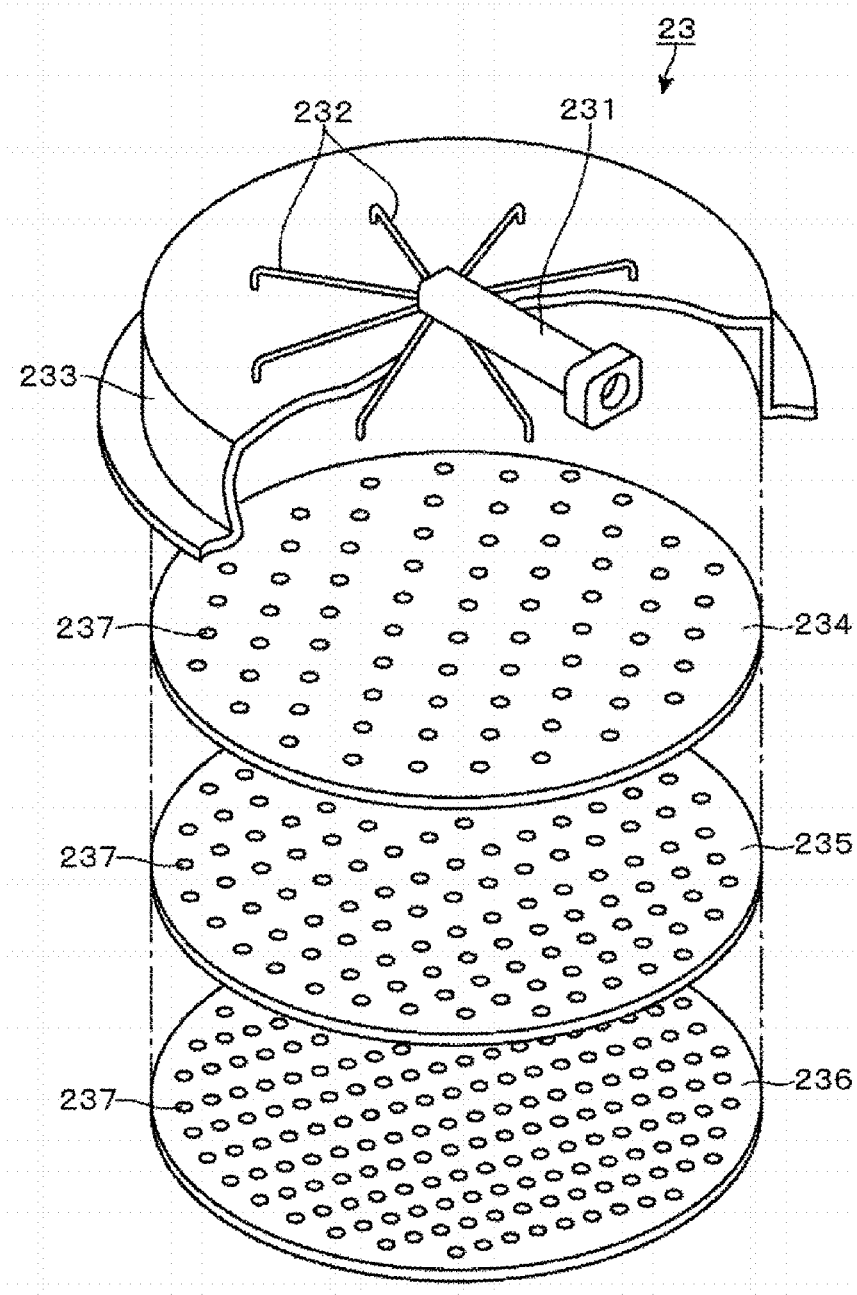
FIG. 5 is an exploded perspective view of a first gas supply unit provided in the liquid processing unit.
Figure 6:
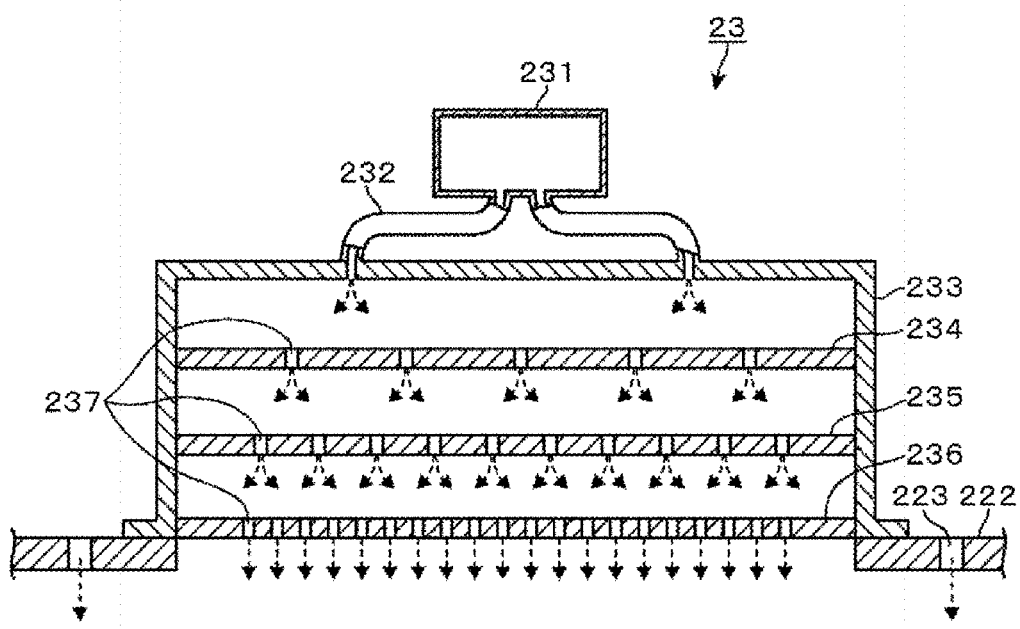
FIG. 6 is a longitudinal side view of the first gas supply unit.

In order to achieve the above-described effects, as shown in FIG. 5, the first gas supply unit 23 in accordance with the illustrative embodiment includes a flat tray-shaped cover 233 whose bottom surface is opened; and a multiple number of, e.g., three flow rectifying plates (a first flow rectifying plate 234, a second flow rectifying plate 235, and a third flow rectifying plate 236) within the cover 233. The three flow rectifying plates 234 to 236 are vertically arranged with a gap therebetween, and a multiple number of vent holes 237 are respectively formed in the flow rectifying plates by punching the flow rectifying plates. Accordingly, as shown in FIG. 6, formed within the first gas supply unit 23 are spaces, through which the dry air flows, between a ceiling plate of the cover 233 and the first flow rectifying plate 234, between the first flow rectifying plate 234 and the second flow rectifying plate 235, and between the second flow rectifying plate 235 and the third flow rectifying plate 236. The gas supplied from a gas supply line 231 connected to a ceiling surface of the cover 233 is introduced into each space through the vent holes 237 formed in the respective flow rectifying plates. Then, the dry air is introduced into the processing space 21 through the vent holes 237 of the third flow rectifying plate 236. Thereafter, the downward flow of the dry air is formed within the processing space 21, and the downward flow of the dry air is moved toward the front surface of the wafer W.

The vent holes 237 formed in the adjacent flow rectifying plates 234 to 236 in a vertical direction are deviated from each other in a horizontal direction. That is, horizontal positions of the vent holes 237 of the adjacent flow rectifying plates 234 to 236 are not aligned to each other when viewed from the top. As a result, as indicated by dashed lines in FIG. 6, the dry air is divided like a cascade shape and flows within the first gas supply unit 23. Then, the dry air is supplied into the processing space 21 at a uniform flow rate. In FIG. 6, as the flow rectifying plates 234 to 236 are positioned toward a downstream side, the number of the vent holes 237 thereof is increased. In this way, aperture ratios of the flow rectifying plates 234 to 236 are gradually increased toward the downstream side, so that discharge flow rates of the dry air from the flow rectifying plates 234 to 236 are decreased toward the downstream side. The method of changing the aperture ratios of the flow rectifying plates 234 to 236 is not limited thereto. By way of example, the flow rectifying plates 234 to 236 may have the substantially same number of the vent holes 237. Here, as the flow rectifying plates 234 to 236 are positioned toward the downstream side, the vent holes 237 may be set to have large diameters.

The third flow rectifying plate 236 provided at a lowest side of the first gas supply unit 23 corresponds to a discharge port for discharging the dry air into the processing space 21. If a size of the discharge port for the dry air is too small, when the dry air is supplied in an amount equal to or greater than an amount of the air flow moved from the first gas supply unit 23 toward the periphery of the wafer W, the discharge flow rate of the dry air becomes too fast. As a result, the trumpet-shaped air flow loses its own shape, and the normal air around the wafer W is introduced thereinto, so that moisture is supplied to the front surface of the wafer W. That is, in order to form a trumpet-shaped downward flow of the dry air above the wafer W, the dry air needs to be supplied in an amount equal to or greater than an amount of the air flow moving toward the periphery of the wafer W through the discharge port having a size enough not to excessively increase the discharge flow rate of the dry air. Accordingly, the present inventors have investigated an appropriate size of the discharge port. The present inventors have found out that a diameter of the discharge port needs to be set to be, desirably, about 100 mm when the liquid process is performed on the wafer W of about 300 mm.

Meanwhile, if the diameter of the discharge port for the dry air is set to be larger than the diameter of the wafer W and the diameter of the opening of the outer cup 31, an amount of the dry air flowing outside the outer cup 31 becomes increased.

Accordingly, the diameter of the discharge port for the dry air is desirably smaller than, for example, the diameter of the wafer W.

As a result, by way of example, when liquid process is performed on a wafer W of about 300 mm while being rotated, it may be desirable to supply the dry air from the first gas supply unit 23 having the discharge port that has a diameter of about 100 mm and more smaller than the diameter of the wafer W at a discharge flow rate capable of prevent the introduction of the normal air around the wafer W, for example, a flow rate sufficient to maintain the trumpet-shaped gas flow. In this way, less moisture is supplied to the front surface of the wafer W, so that the wafer W and the atmosphere (processing atmosphere) around the wafer W can be locally controlled to be at low humidity.

Further, it is desirable to set an average discharge flow rate of the normal air supplied from the second supply unit 22 to be equal to an average discharge flow rate of the dry air supplied from the first gas supply unit 23. Here, the term of "equal" is not limited to a case where the discharge flow rate of the normal air need is exactly equal to the discharge flow rate of the dry air. If a difference between the discharge flow rate of the normal air and the discharge flow rate of the dry air is within a range, the discharge flow rate of the normal air and the discharge flow rate of the dry air may be regarded as equal. Here, the range may be sufficient to maintain the trumpet-shaped air flow formed by the rotation of the wafer W. Further, the range may be sufficient to prevent an air flow from being mixed with another air flow.

As shown in FIGS. 4 and 5, the first gas supply unit 23 is provided with branch lines 232 branched from the gas supply line 231. The branch lines 232 uniformly supplies dry air into the space formed between the ceiling surface of the cover 233 and the first flow rectifying plate 234. Desirably, discharge holes of the branch lines 232 are deviated from the vent holes 237 of the first flow rectifying plate 234 in a horizontal direction.

As shown in FIG. 3, a line connected to a base end of the gas supply line 231 is branched into a dry air line 401 and a bypass line 402 via a switching valve V1. Moisture of the normal air supplied through an air blow fan 41 and a particle filter 42 provided at an upstream side is reduced in a moisture removal unit 44 provided at the dry air line 401. By way of example, the moisture removal unit 44 may include a filling layer filled with silica gel, or a chamber for condensing moisture contained in the normal air by winding a coolant cooling line around the space through which the normal air flows. However, the method of reducing moisture is not limited to the above-described specific method. During the IPA drying process, in order to control the processing atmosphere around the wafer W to be at low humidity, it is desirable to set relative humidity of the dry air supplied from the moisture removal unit 44 to be, e.g., about 10% or less. Here, the dry air supplied into the first gas supply unit 23 may be introduced from outside, e.g., a common power supply line outside a plant.

Further, in the illustrative embodiment, the normal air may be supplied into the first gas supply unit 23 through the bypass line 402 that bypasses the moisture removal unit 44. The lines 401 and 402 are switched by a flow path switching valve 43.

As shown in FIGS. 2 and 3, the above-described liquid processing system 1 is connected to a controller 5. The controller 5 includes, for example, a non-illustrated computer having, e.g., a CPU and a storage unit. The storage unit stores therein programs including a step (command) group for controlling operations of the liquid processing system 1 and the respective liquid processing units 2, i.e., processes for unloading the wafer W from the FOUP 100 mounted on the mounting block 11; loading the wafer W into the respective liquid processing units 2; performing the liquid process on the wafer W; and returning the wafer W into the FOUP 100. These programs may be stored in a storage medium such as a hard disk, a compact disk, a magneto-optical disk, or a memory card, and may be installed on the computer.

As shown in FIG. 3, specifically, the controller 5 is configured to output control signals to various switching valves V1 and 43 so as to change supply timing of the processing solution, a supply amount of the processing solution, a discharging target position of the processing solution, and a type of clean air supplied from the first gas supply unit 23.

Now, an operation of the liquid processing system 1 having the above-described configuration will be explained. First, a single sheet of wafer W is taken out of the FOUP 100 mounted on the mounting block 11 by the first wafer transfer device 121, and, then, is mounted on the transit shelf 131. This operation is repeatedly performed. The wafer W mounted on the transit shelf 131 is transferred to the transfer section 142 by the second wafer transfer device 143, and loaded into one of the liquid processing units 2 and held on the rotation plate 33.

After the wafer W is loaded, the processing solution supply nozzle 35 is moved to a position above the central portion of the wafer W. An alkaline processing solution such as a SC1 solution is supplied to the front surface and the rear surface of the wafer W while rotating the wafer W at, e.g., about 10 rpm to about 1000 rpm. In this way, by forming liquid films of a chemical liquid on the front surface and the rear surface of the wafer W, particles and organic contaminants are removed by the alkaline processing solution (alkali cleaning process). Subsequently, the processing solution supplied to the front surface and the rear surface of the wafer W is changed into a rinse solution, and a rinse process is performed on the wafer W. Thereafter, the supply of the rinse solution is stopped.

Figure 9:
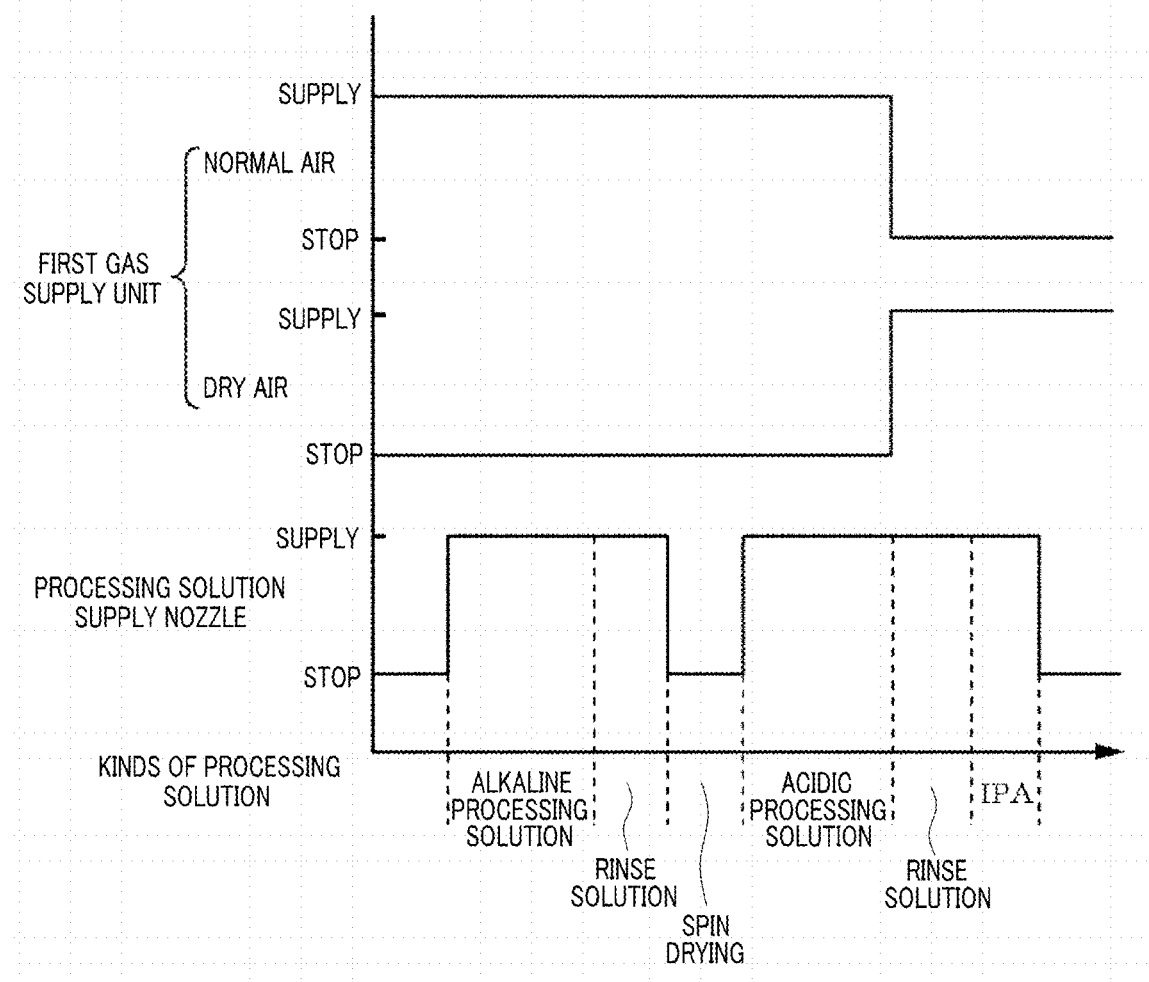
FIG. 9 is a time chart showing a relationship between a kind of a processing solution supplied to a wafer and a kind of a gas supplied from the first gas supply unit.

During the alkali cleaning process and the rinse process, a watermark is hardly formed by moisture in the clean air supplied to the surfaces of the wafer W. Further, when a high volatile chemical liquid is used during these cleaning processes, it may be desirable that the clean air contains moisture. Accordingly, during these cleaning processes, the flow path switching valve 43 shown in FIG. 3 is switched to the bypass line 402, and, thus, the normal air is supplied from the first gas supply unit 23 (FIG. 9). Further, the normal air from the second gas supply unit 22 is continuously supplied. During the liquid process that is less affected by moisture, the normal air may be supplied from the first gas supply unit 23 by bypassing the moisture removal unit 44. Accordingly, an operating rate of the moisture removal unit 44 is decreased, so that running costs can be reduced. Also, during the liquid process that is less affected by moisture, the air supplied from the first supply unit 23 may be, for example, a mixed air of the dry air and the normal air.

Upon completion of the rinse process, an acid processing solution such as a DHF solution is supplied to the front surface and the rear surface of the wafer W, while rotating the wafer W at about 10 rpm to about 1000 rpm. Accordingly, by forming liquid films of the DHF solution on the front surface and the rear surface of the wafer W, the liquid process of removing a native oxide film formed on the front surface of the wafer W is performed. After a certain period of time lapses, the processing solution is changed into a rinse solution, and a rinse process is performed on the wafer W.

In these operations, for example, during the liquid process using the acid processing solution, the first gas supply unit 23 is connected to the bypass line 402, and the normal air is supplied from the first gas supply unit 23. For example, at the timing of performing the rinse process, in order to prepare for the IPA drying process performed after the rinse process, the first gas supply unit 23 is connected to the dry air line 401, and the dry air is started to be supplied into the processing space 21 (FIG. 9). As a result, a trumpet-shaped downward flow of the dry air is formed (FIG. 7).

Upon completion of the rinse process, when the downward flow of the dry air moving toward the front surface of the wafer W is formed, the rotation number of the wafer W is adjusted to be, e.g., about 1000 rpm, and the processing solution to be supplied to the front surface of the wafer W is changed into IPA. As a result, the IPA drying process using IPA is performed. The solution such as the rinse solution remaining on the front surface of the wafer W is removed. The rinse solution remaining on the rear surface of the wafer W is removed by rotating the wafer W.

Figure 8:
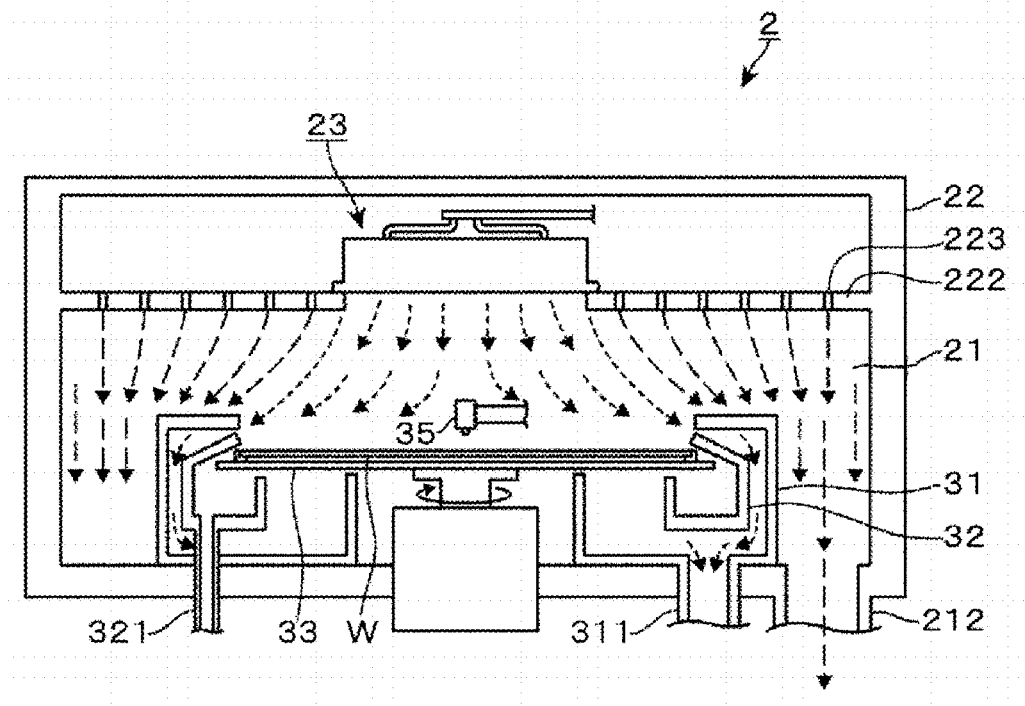
FIG. 8 is an explanatory diagram for explaining a gas flow in the liquid processing unit during a liquid process.

FIG. 8 schematically illustrates the downward flow of the clean air formed within the processing space 21. In FIG. 8, a flow of the dry air is presented by short dashed lines and a flow of the normal air is presented by long dashed lines. A downward flow of the dry air discharged from the first gas supply unit 23 is formed from a region above the wafer W toward the entire front surface thereof along the air flow (see FIG. 7) formed by the rotation of the wafer W. Meanwhile, a downward flow of the normal air supplied from the second gas supply unit 22 is formed so as to surround the downward flow of the dry air supplied from the first gas supply 23. In this way, the downward flow of the dry air is formed above the front surface of the wafer W, so that it is possible to prevent the normal air from being introduced into the processing atmosphere on the front surface of the wafer W. Further, the downward flow of the normal air is formed around the downward flow of the dry air, so that it is possible to prevent an updraft of the atmosphere within the processing space 21.

As a result, it is possible to prevent moisture from being introduced into the processing atmosphere on the front surface of the wafer W during the IPA drying process. Accordingly, less moisture is introduced into IPA, so that the generation of a watermark can be suppressed. Furthermore, the updraft of the atmosphere within the processing space 21 is prevented, so that the processing space 21 can be controlled to be in a clean state.

After the IPA is supplied for a certain period of time, the supply of the IPA is stopped, and the wafer W is continuously rotated. Therefore, the IPA on the front surface of the wafer W can be removed. Upon completion of the drying process of the wafer W, the liquid process of the wafer W is finished.

FIG. 9 shows one example of a switching sequence between the dry air and the normal air supplied from the first gas supply unit 23. The method of supplying the dry air and the normal air is not limited to this example. By way of example, during a dry air supply process, the dry air is supplied in an amount of about 200 L/min from the first gas supply unit 23, and the normal air is supplied in an amount of about 800 L/min from the second gas supply unit 22. Meanwhile, during a normal air supply process, the supply of the dry air from the first gas supply unit 23 is stopped, and an amount of the normal air supplied from the second gas supply unit 22 is increased to about 1000 L/min. Even though the supply of the dry air is stopped, the normal air supplied from the second supply unit 22 is introduced to the region above the wafer W. As a result, as shown in FIG. 7, a trumpet-shaped air flow of the normal air is formed, and flows over the entire front surface of the wafer W. Then, the trumpet-shaped air flow of the normal air is exhausted from the gas exhaust line 311. In this case, by uniformly maintaining a total amount of air supplied into the processing space 21, a pressure variation of the processing space 21 can be suppressed.

The switching timing between the normal air and the dry air is not limited to this example illustrated in FIG. 9. By way of example, the dry air may be supplied from the first gas supply unit 23 at a timing when a low humidity processing atmosphere needs to be formed on the front surface of the wafer W.

Upon completion of the liquid process, the wafer W is unloaded from the liquid processing unit 2 by the transfer arm 144, and, then, is mounted on the transit shelf 131. Thereafter, the wafer W is returned to the FOUP 100 from the transit shelf 131 by the first wafer transfer device 121. In this way, the liquid process is sequentially performed on a multiple number of wafers W in the multiple number of liquid processing units 2 provided in the liquid processing system 1.

The liquid processing unit 2 in accordance with the illustrative embodiment achieves the following effects. The downward flow of the dry air is formed toward the entire front surface of the wafer W as the liquid processing target object. Further, the downward flow of the normal air is formed in a region surrounding the downward flow of the dry air. Accordingly, the dry air is locally supplied to the wafer W. Further, during the IPA drying process, the processing atmosphere on the front surface of the wafer W is controlled to be at low humidity, so that the generation of a watermark can be suppressed. Meanwhile, the downward flow of the normal air, which is not controlled to contain less moisture, is formed in a region that does not affect the IPA drying process. Accordingly, a consumption amount of the dry air is decreased as compared to a case where the dry air is supplied into an entire region within the processing space 21. As a result, supply costs of the dry air can be reduced.

Both the dry air supplied from the first supply unit 23 and the normal air supplied from the second gas supply unit 22 serve as downward flows within the processing space 21. Accordingly, it is possible to prevent an updraft of the atmosphere within the processing space 21, so that the processing space 21 can be controlled to be in a clean state.

Further, since the first gas supply unit 23 for supplying the dry air is provided on the processing space 21, as explained in the section "BACKGROUND OF THE INVENTION", a device such as the top plate used for maintaining the processing atmosphere on the front surface of the wafer W at low humidity need not be provided in the processing space 21. Furthermore, a processing solution supply unit capable of avoiding interference from the top plate need not be provided in the processing space 21. Accordingly, the configuration of the liquid processing apparatus can be simplified. Moreover, since the top plate is not moved up and down, the dry air can be supplied so as not to disturb the downward flow formed within the processing space 21.

In the illustrative embodiment explained with reference to FIG. 3, the dry air is used as a first gas flowing down toward the entire front surface of the wafer W. Further, the normal air is used as a second gas flowing in a region surrounding the downward flow of the first gas. However, types of the first and second gases are not limited thereto. For example, as the first gas, an inert gas such as a nitrogen gas containing no moisture may be used.

When a process that is prevented from being performed under an atmosphere containing much oxygen is performed, for example, when a liquid process is performed on the wafer W having thereon a metallic wiring such as a copper wiring, if oxygen is supplied to the front surface of the wafer W, it may cause adverse effects such as oxidation of the copper wiring. In this case, an inert gas such as a nitrogen gas or an argon gas not containing oxygen may be used as the first gas, and the normal air may be used as the second gas, so that a downward flow of the first gas and a downward flow of the second gas may be formed within the processing space 21. Thus, the processing atmosphere on the wafer W can be controlled to be at a low oxygen level.

Regardless of types of the processing solutions, in order to reduce an amount of oxygen supplied to the front surface of the wafer W, it is desirable to constantly supply the first gas from the first gas supply unit 23 during all the chemical liquid process, the rinse process, and the drying process.

Figure 10:
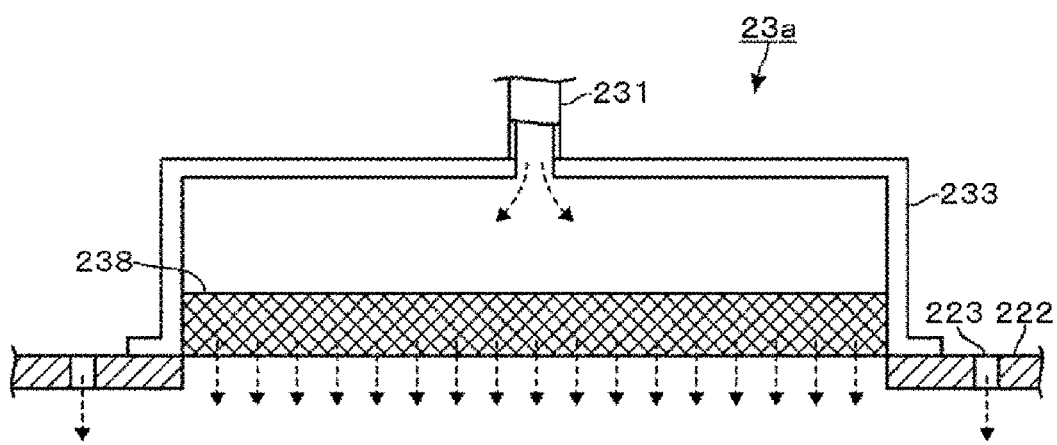
FIG. 10 is a longitudinal side view showing another example of the first gas supply unit.

FIG. 10 shows a first gas supply unit 23a for uniformly supplying a first gas, as another example of the first gas supply unit. The first gas supply unit 23a includes a porous body 238 made of ceramics or sintered ceramics particles, and the porous body 238 is provided at a bottom surface of the cover 233. Instead of the third flow rectifying plate 236 or the porous body 238, a mesh may be provided. Further, as for the second gas supply unit 22, it is not limited to the bottom plate 222 provided with the vent holes 223 by punching the bottom plate 222. By way of example, the second gas may be supplied into the processing space 21 through the bottom plate 222 on which a porous body or a mesh is provided.

Figure 11:
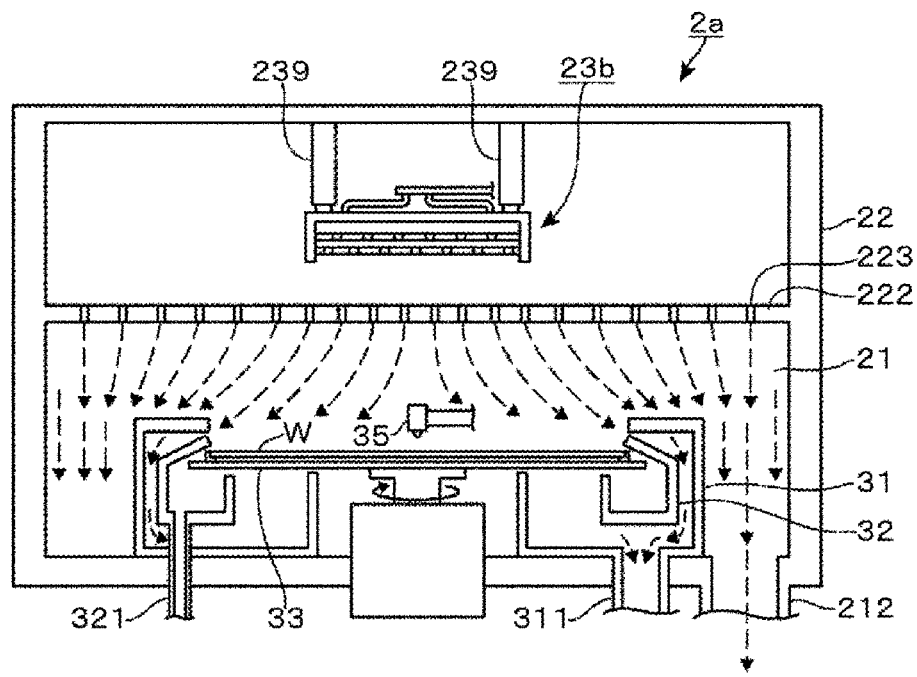
FIG. 11 is a first explanatory diagram of a liquid processing unit having a vertically movable first gas supply unit.
Figure 12:
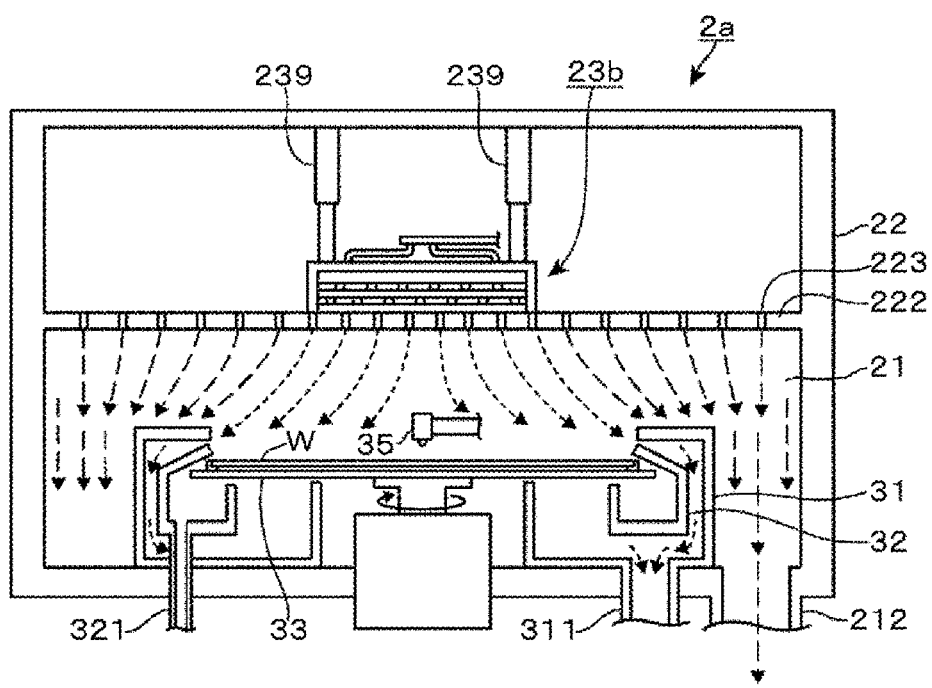
FIG. 12 is a second explanatory diagram of the liquid processing unit having the vertically movable first gas supply unit.

FIGS. 11 and 12 show a liquid processing unit 2a as another example of the liquid processing unit. The liquid processing unit 2a is configured to selectively form the downward flow of the first gas and the downward flow of the second gas toward the entire front surface of the wafer W. In the present example, the first gas supply unit 23b is moved up and down within the second gas supply unit 22 by an elevating device 239. As shown in FIG. 11, during a period of time when no downward flow of the first gas is formed, the first gas supply unit 23b is retreated to a retreated position at an upper region. In this state, the second gas is supplied toward the front surface of the wafer W from the vent holes 223 of the bottom plate 222 provided below the first gas supply unit 23b. Meanwhile, when the liquid process is performed, in order to form the processing atmosphere on the wafer W by the first gas, the first gas supply unit 23b is moved down as shown in FIG. 12. Then, a part of the bottom plate 222 is covered by the first gas supply unit 23b. In this state, the first gas is supplied through the vent holes 223 of the bottom plate 222.

Figure 13:
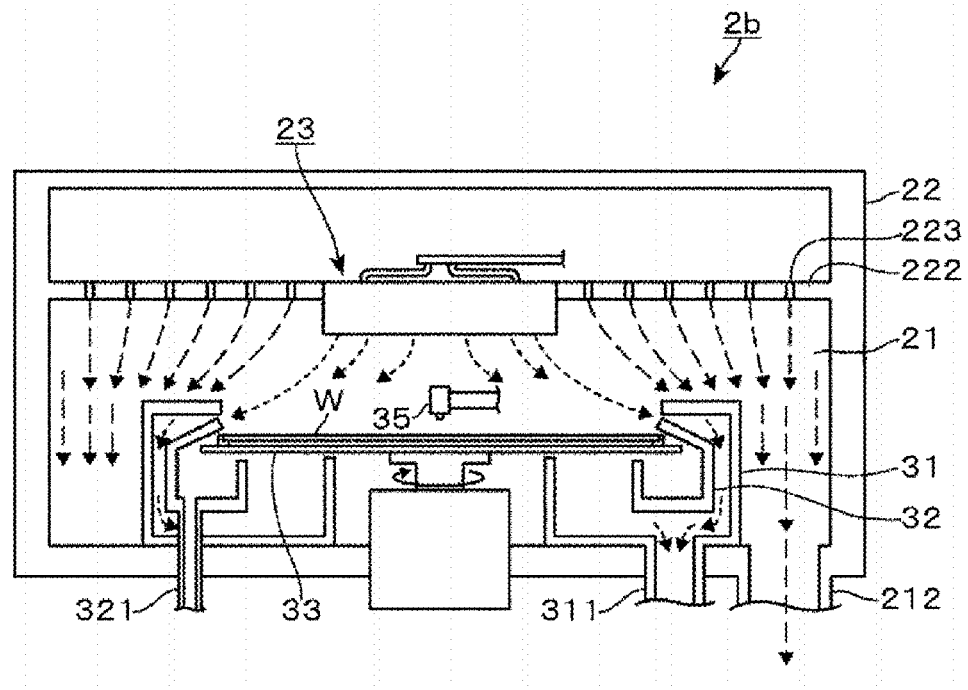
FIG. 13 shows a liquid processing unit in which a position height of the first gas supply unit is changed.

A position of the first gas supply unit 23 for supplying the first gas and a position of the second gas supply unit 22 for supplying the second gas may not be aligned on the same plane. By way of example, as shown in the liquid processing unit 2b of FIG. 13, the vent holes of the first gas supply unit 23 may be positioned lower than the vent holes (the ceiling surface of the processing space 21 in this example) of the second gas supply unit 22. Accordingly, the first gas may be supplied from a position lower than the second gas, so that it is possible to prevent the second gas from being introduced into the atmosphere of the first gas.

Figure 14:
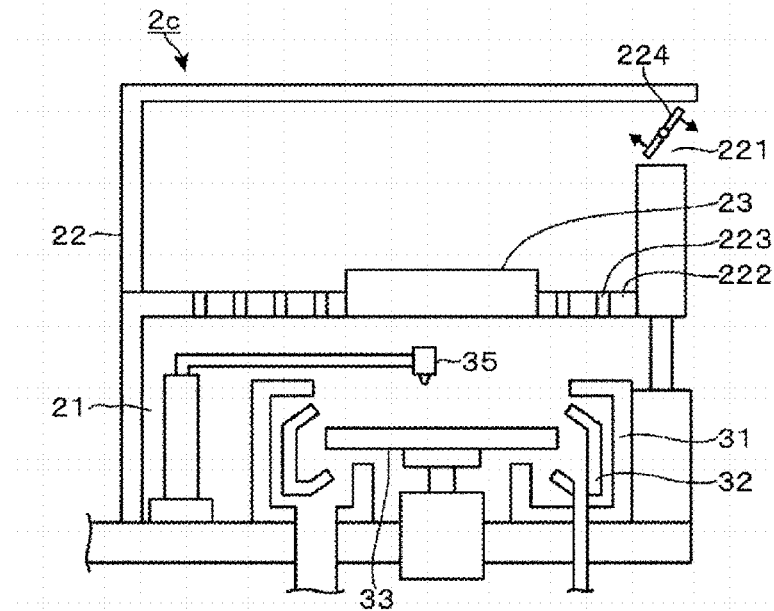
FIG. 14 is an explanatory diagram showing a configuration example of a first gas supply unit having a flow rate control valve.
Figure 15:
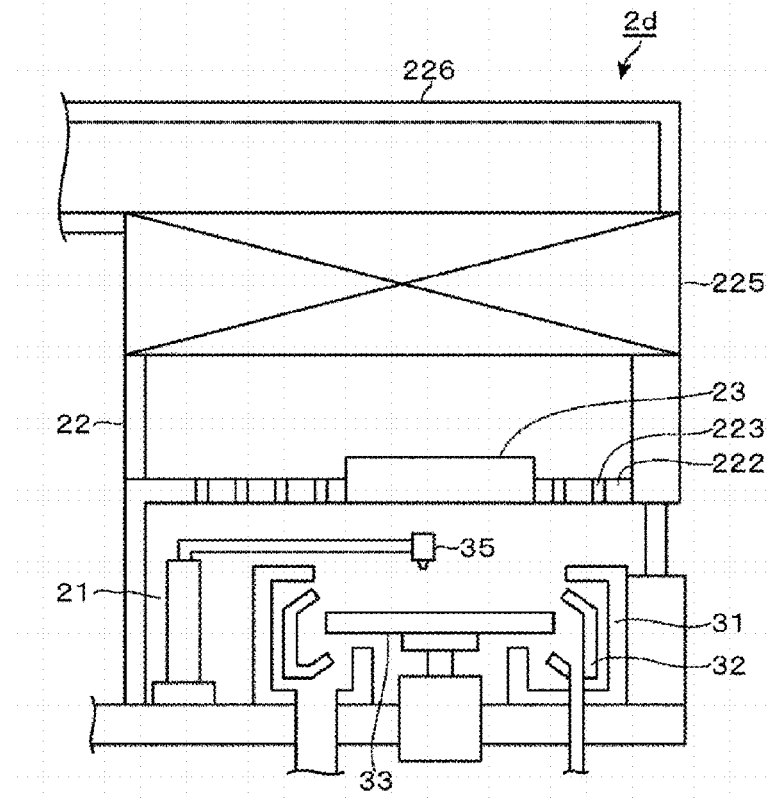
FIG. 15 is an explanatory diagram showing a configuration example of a first gas supply unit having a fan filter unit (FFU).

The configuration of the second gas supply unit 22 is not limited to the configuration example illustrated in FIGS. 3 and 4. By way of example, in a liquid processing unit 2c shown in FIG. 14, by providing a flow rate control valve 224 at the opening 221 of the second gas supply unit 22, the discharge flow rate of the normal air from the vent holes 223 may be adjusted, and the discharge flow rate of the normal air may be set to be equal to the discharge flow rate of the dry air from the first gas supply unit 23. Further, as illustrated in FIG. 15, by providing a FFU 225 on the second gas supply unit 22, the normal air may be independently supplied from a gas exhaust duct 226 into each liquid processing unit 2d.

Although there has been described the case where the liquid process is performed on the semiconductor wafer being rotated, the target substrate is not limited to the semiconductor wafer. Another target substrate may be used as long as a target substrate is capable of being processed while being rotated. By way of example, the target substrate includes a mask glass substrate, a liquid crystal glass substrate, a plasma display glass substrate, a field emission display (FED) substrate, an optical disk substrate, a magnetic disk substrate, and a magneto-optical disk substrate.

There has been described the liquid processing apparatus in accordance with the illustrative embodiment applied to the liquid processing unit 2 configured to perform the cleaning process by supplying an alkaline, acidic, or an organic solvent processing solution to the wafer W. However, types of the liquid process performed by the liquid processing apparatus of the illustrative embodiment are not limited thereto. By way of example, another liquid processing apparatus may be used as long as a liquid processing apparatus needs to form a processing atmosphere (e.g., a processing atmosphere of low humidity or a processing atmosphere of low oxygen) suitable for a liquid process to be performed while rotating a target substrate such as a wafer or a square substrate.

There has been described the case where the dry air and the normal air are supplied from the first gas supply unit 23 and the second gas supply unit 22, respectively. However, kinds of gases supplied from the first gas supply unit 23 and the second gas supply unit 22 are not limited thereto. By way of example, a gas adjusted to have a higher temperature than a room temperature may be supplied from the first gas supply unit 23, and normal air having a room temperature may be supplied from the second gas supply unit 22. With this configuration, by supplying a high-temperature processing solution to the wafer W, it is possible to suppress a decrease of a temperature of the processing solution, or it is possible to accelerate the liquid process. Further, a gas may be supplied from the first gas supply unit 23 through a chemical filter, and normal air may be supplied from the second gas supply unit 22. With this configuration, it is possible to prevent a chemical substance from being introduced into the processing atmosphere on the front surface of the wafer W, and it is possible to prevent an unnecessary chemical reaction from occurring on the front surface of the wafer W. A gas not containing an acid, alkali, or organic substance may be supplied from the first gas supply unit 23. With this configuration, even when different kinds of chemical liquids are used in the process of the wafer W, the processing atmosphere on the front surface of the wafer W can be rapidly changed, so that it is possible to suppress generation of particles. Depending on types of chemical liquids used in the process of the wafer W, a gas containing an acid, alkali, or organic substance may be supplied from the first gas supply w 23. Accordingly, even when a chemical liquid that is easily deteriorated during the process for the wafer W, by forming the same processing atmosphere on the front surface of the wafer W as the chemical liquid, it is possible to suppress the deterioration of the chemical liquid. When a chemical liquid of high volatility, e.g., a thinner is used, it is possible to easily diffuse the chemical liquid over the front surface of the wafer W while suppressing the volatility of the chemical liquid.

While a gas is supplied from the first gas supply unit 23, a flow rate of the gas may be changed. That is, since an amount of a gas flow moving toward the periphery of the wafer W varies depending on a rotation speed of the wafer W, an amount of the gas supplied from the first gas supply unit 23 may be changed based on the rotation speed of the wafer W. Specifically, an amount of the gas supplied from the first gas supply unit 23 is increased when the rotation number of the wafer W is increased, whereas the amount of the gas supplied from the first gas supply unit 23 is decreased when the rotation number of the wafer W is decreased. In this way, it is possible to form a trumpet-shaped downward flow of the minimum amount of gas.

What is claimed is:

1. A liquid processing apparatus that performs a liquid process by supplying a processing solution to a surface of a target substrate, the liquid processing apparatus comprising:
    a housing in which the liquid process is performed;
    a rotation unit configured to hold the target substrate within the housing and rotate the target substrate around a vertical axis;
    a processing solution supply nozzle configured to supply the processing solution to the surface of the target substrate being held and rotated by the rotation unit;
    a cup provided around the rotation unit;
    a first gas supply unit, provided to face the target substrate held by the rotation unit, configured to form a downward flow of a first gas that flows over the entire surface of the target substrate and is introduced into the cup in order to form a processing atmosphere on the surface of the target substrate;
    a second gas supply unit configured to form a downward flow of a second gas different from the first gas in a region outside the downward flow of the first gas; and
    a controller configured to control rotation speed of the target substrate and a flow rate of the first gas supplied from the first gas supply unit to form a trumpet-shaped flow of the first gas, such that the entire surface of the target substrate is covered with the first gas and the second gas is supplied so that the second gas is suppressed from being introduced into the trumpet-shaped flow of the first gas,
    wherein the first gas supply unit and the second gas supply unit are provided at a ceiling portion of the housing.

2. The liquid processing apparatus of claim 1,
    wherein the controller is configured to control the flow rate of the first gas supplied from the first gas supply unit to be higher than a flow rate of a gas flow flowing toward a periphery of the target substrate due to the rotation of the target substrate.

3. The liquid processing apparatus of claim 1,
    wherein the controller is configured to control a discharge flow rate of the first gas from the first gas supply unit to be equal to a discharge flow rate of the second gas from the second gas supply unit.

4. The liquid processing apparatus of claim 1, further comprising:
    a first gas exhaust port, provided at an inside of the cup, configured to mainly exhaust the first gas; and
    a second gas exhaust port, provided at an outside of the cup, configured to mainly exhaust the second gas.

5. The liquid processing apparatus of claim 1,
    wherein the first gas supply unit is configured to selectively supply the first gas or the second gas.

6. The liquid processing apparatus of claim 1,
    wherein the first gas supply unit is configured to be movable between a position for forming the downward flow of the first gas and a retreated position within the second gas supply unit, and
    when the first gas supply unit is positioned at the retreated position, instead of the downward flow of the first gas, the second gas supply unit is further configured to form the downward flow of the second gas flowing toward the entire surface of the target substrate.

7. The liquid processing apparatus of claim 1,
    wherein the target substrate has a circular shape, and
    the first gas supply unit includes a circular discharge port having a diameter of about 100 mm or more and smaller than a diameter of the target substrate.

8. The liquid processing apparatus of claim 7, further comprising:
    a flow rectifying plate, having a plurality of vent holes which supplies the first gas from the discharge port at a uniform flow rate, provided at the discharge port.

9. The liquid processing apparatus of claim 1,
    wherein the first gas supply unit is configured to supply dry air or an inert gas as the first gas.

* * * * *